United States Patent
Hanft et al.

(10) Patent No.: US 11,139,164 B2
(45) Date of Patent: Oct. 5, 2021

(54) ELECTRONIC DEVICE INCLUDING HERMETIC MICRO-CAVITY AND METHODS OF PREPARING THE SAME

(71) Applicant: Raytheon Company, Waltham, MA (US)

(72) Inventors: Thomas A. Hanft, Allen, TX (US); Michael A. Moore, Forth Worth, TX (US); John Bedinger, Garland, TX (US)

(73) Assignee: Raytheon Company, Waltham, MA (US)

( * ) Notice: Subject to any disclaimer, the term of this patent is extended or adjusted under 35 U.S.C. 154(b) by 13 days.

(21) Appl. No.: 16/712,679

(22) Filed: Dec. 12, 2019

(65) Prior Publication Data
US 2021/0183647 A1   Jun. 17, 2021

(51) Int. Cl.
*H01L 21/02* (2006.01)
*H01L 23/29* (2006.01)
*H01L 21/768* (2006.01)
*H01L 23/532* (2006.01)

(52) U.S. Cl.
CPC .... *H01L 21/02362* (2013.01); *H01L 21/0228* (2013.01); *H01L 21/76829* (2013.01); *H01L 23/29* (2013.01); *H01L 23/5329* (2013.01)

(58) Field of Classification Search
CPC ........... H01L 21/02362; H01L 23/5329; H01L 21/0228; H01L 21/76829; H01L 23/29
See application file for complete search history.

(56) References Cited

U.S. PATENT DOCUMENTS

| 8,159,056 | B1 | 4/2012 | Kim et al. | |
| 2010/0167002 | A1 | 7/2010 | Chu et al. | |
| 2012/0270371 | A1* | 10/2012 | DeBar | H01L 21/56 438/127 |
| 2013/0250527 | A1 | 9/2013 | Hatanaka et al. | |
| 2016/0133689 | A1* | 5/2016 | Guo | H01G 4/236 257/532 |
| 2018/0286908 | A1* | 10/2018 | Yamazaki | H01L 27/14645 |
| 2019/0267570 | A1* | 8/2019 | Huang | H01L 51/5246 |

OTHER PUBLICATIONS

International Search Report for corresponding International Application No. PCT/US2020/051297, filed Sep. 17, 2020, International Search Report dated Oct. 30, 2020 and dated Nov. 10, 2020 (4 pgs.).
Written Opinion of the International Searching Authority for corresponding International Application No. PCT/US2020/05197, filed Sep. 17, 2020, Written Opinion of the International Searching Authority dated Nov. 10, 2020 (7 pgs.).

* cited by examiner

*Primary Examiner* — Karen Kusumakar
(74) *Attorney, Agent, or Firm* — Lewis Roca Rothgerber Christie LLP

(57) ABSTRACT

An electronic device includes: a water impermeable substrate; at least one electronic circuit on the water impermeable substrate; a dielectric encapsulant on the electronic circuit; a capping layer comprising a polymer on the dielectric encapsulant; and a barrier layer on the capping layer, the water impermeable substrate, the dielectric encapsulant, the capping layer, and the barrier layer forming a hermetically sealed micro-cavity.

19 Claims, 9 Drawing Sheets

ELECTRONIC DEVICE INCLUDING HERMETIC MICRO-CAVITY AND METHODS OF PREPARING THE SAME

BACKGROUND

Electronic devices may be coated or underfilled for non-hermetic applications. Coatings on the electronic devices may include conformal coatings, encapsulants, and underfills that are polymeric and have a higher dielectric constant and loss tangent than air. Such coatings decrease performance (e.g., output power and/or efficiency) of monolithic microwave integrated circuits (MMICs). Low dielectric constant coatings may be used to reduce such decreases in performance.

In non-hermetic applications having high performance and/or reliability, barrier layers are utilized with encapsulation to protect the integrated circuits. The barrier layers can be applied to integrated circuits in a face up or "flip chip" configuration. Face up and flip chip circuits are coated with barrier layers to provide protection from common environmental contaminants, such as, for example, water vapor, condensed water, conductive particles, ionic impurities, and corrosive liquids and gases, such as coolant, exhaust fumes, and the like.

SUMMARY

According to embodiments of the disclosure, an electronic device includes: a water impermeable substrate; at least one electronic circuit on the water impermeable substrate; a dielectric encapsulant on the electronic circuit; a capping layer comprising a polymer on the dielectric encapsulant; and a barrier layer on the capping layer, wherein the water impermeable substrate, the dielectric encapsulant, the capping layer, and the barrier layer form a hermetically sealed micro-cavity.

The barrier layer may include an inorganic material or a composite of organic and inorganic materials.

The inorganic material may be selected from metal oxides, metal alloys, metal carbides, metal nitrides, and mixtures thereof.

The metal oxide may be selected from silicon dioxide, aluminum oxide, zirconium dioxide, hafnium dioxide, titanium dioxide, and mixtures thereof.

The metal carbide may be silicon carbide.

The metal nitride may be silicon nitride.

The transmission rate of water through the capping layer and the barrier layer is less than 0.01 gram/meter$^2$/day when measured at 40° C. and 90% relative humidity.

The capping layer may include poly(para-xylylene).

The poly(para-xylylene) may be selected from the group consisting of unsubstituted linear poly(para-xylylene), poly-monochloro(para-xylylene), (poly-dichloro(para-xylylene), poly(para-xylylene) having the alpha hydrogen atoms substituted with fluorine atoms, poly(para-xylylene) having the four hydrogen atoms bonded to the aromatic ring substituted with fluorine atoms, and combinations thereof.

The capping layer may have a thickness of 1 μm to 25 μm.

Hydroxyl groups may be present on a surface of the barrier layer.

The electronic circuit may be water sensitive or sensitive to dielectric loading.

The dielectric encapsulant may include an aerogel film.

The barrier layer may be formed by atomic layer deposition.

The water impermeable substrate may include a material selected from the group consisting of silicon (Si), gallium arsenide (GaAs), gallium nitride (GaN), silicon germanium (SiGe), silicon carbide (SiC), indium phosphide (InP), alumina, aluminum nitride (AlN), beryllium oxide (BeO), and combinations thereof.

The electronic device may further include a base layer between the dielectric encapsulant and the water impermeable substrate.

The base layer may include a dielectric layer.

According to embodiments of the disclosure, a method of forming the electronic device includes securing a water impermeable substrate having at least one electronic circuit on the water impermeable substrate, forming a dielectric encapsulant on the electronic circuit, forming a capping layer comprising a polymer on the dielectric encapsulant, and forming a barrier layer on the capping layer, wherein the water impermeable substrate, the dielectric encapsulant, the capping layer, and the barrier layer form a hermetically sealed micro-cavity.

The forming of the capping layer may include vapor depositing the polymer on the dielectric encapsulant.

The forming of the capping layer may include patterning the capping layer.

The patterning of the capping layer may be performed by laser ablation.

The method may further include pretreating a surface of the dielectric encapsulant with a plasma treatment prior to the forming of the capping layer.

The method may further include patterning the dielectric encapsulant.

The patterning of the dielectric encapsulant may be performed by laser ablation.

The forming of the barrier layer comprises depositing the barrier layer by atomic layer deposition.

The method may further include forming a base layer on the substrate prior to the forming of the dielectric encapsulant, wherein the base layer includes a dielectric layer.

The method may further include depositing an organosilane coupling agent on the water impermeable substrate prior to the forming of the capping layer.

BRIEF DESCRIPTION OF THE DRAWINGS

The accompanying drawings, together with the specification, illustrate embodiments of the present disclosure, and, together with the description, serve to explain the principles of the present disclosure.

DETAILED DESCRIPTION

Figure 1:
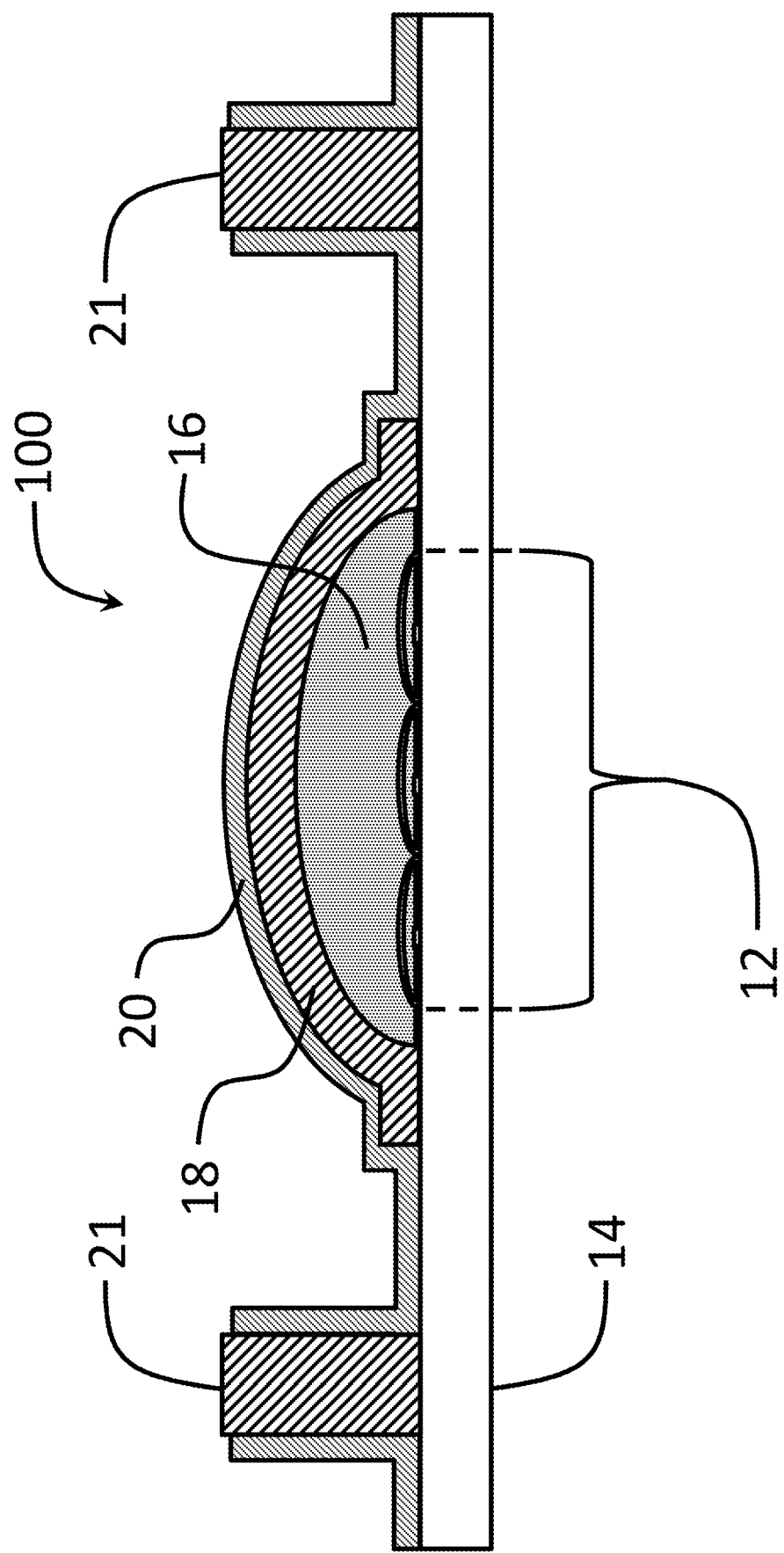
FIG. 1 is a cross-sectional view of a portion of an embodiment of an electronic device.

The present disclosure relates to an electronic device, embodiments of which have a hermetic micro-cavity architecture. For example, embodiments of the present disclosure relate to a field effect transistor (FET) level solution that allows conformal coatings (e.g., poly(para-xylylene) or parylene), encapsulants, and/or underfills to be utilized while not degrading (or substantially degrading) performance or disrupting the processes for wafer fabrication and bumping (for flip chips), which may be complex. Additionally, the FET may be protected from the corrosive effects of liquids and gases, such as, for example, flux cleaners and water vapor, and/or the dielectric loading effect of contaminants having a high dielectric constant, such as, for example, condensed water droplets, in order to preserve (or substantially maintain) the performance and/or reliability of the electronic device.

Embodiments of the electronic device include a water impermeable substrate, at least one electronic circuit on the substrate, a dielectric encapsulant on the substrate and covering the electronic circuit, a capping layer on the dielectric encapsulant, and a barrier layer on the capping layer. As described herein, the water impermeable substrate is substantially impermeable to water vapor and may prevent or reduce the penetration of water through the substrate to the at least one electronic circuit component. In some embodiments, water and, optionally, other components pass through the substantially impermeable substrate, if at all, at impurity levels that are undetectable and/or levels that do not substantially interfere with the operation and/or lifetime of the electronic circuit.

The electronic circuit may be a sensitive component or region, such as an electronic circuit that is sensitive to corrosion by moisture and/or dielectric loading from polymer coatings or contaminants, such as, condensed moisture, but the present disclosure is not limited hereto. For electronic circuits that are sensitive to dielectric loading, the dielectric encapsulant may be an aerogel having a dielectric constant less than or equal to about 1.5 and a loss tangent that is less than about 0.010 at X-band frequencies or higher (e.g., 8 GHz or higher, such as, for example, 8 GHz to 12 GHz, or higher).

The capping layer may include a polymer that is void free (e.g., substantially or completely free of voids) and permeable to gases, but resistant to penetration by liquids encountered in the electronics industry during processing and/or use (e.g., not readily penetrated or dissolved by liquid water and/or solvents, including, for example, ethanol, methanol, isopropyl alcohol, commercial flux cleaning agents, etc.). For example, the capping layer may include any suitable parylene (e.g., poly(para-xylylene)), fluoropolymer (e.g., polytetrafluoroethylene (PTFE)), polysiloxane (e.g., polydimethylsiloxane), or combinations thereof, available in the art. In some embodiments, the polymer includes poly(para-xylylene) selected from the group consisting of unsubstituted linear poly(para-xylylene), poly-monochloro(para-xylylene), (poly-dichloro(para-xylylene), poly(para-xylylene) having the alpha hydrogen atoms substituted with fluorine atoms, poly(para-xylylene) having four hydrogen atoms bonded to the aromatic ring substituted with fluorine atoms, and combinations thereof. The capping layer may be formed by any suitable method such as, for example, vapor deposition, which allows application at any level or stage of assembly, and avoids infiltrating the dielectric encapsulant with solvents or trapping the solvents inside the electronic device prior to sealing. Vapor deposition does not require liquids to contact the dielectric encapsulant, and thus, avoids or reduces the surface tension effects of a meniscus during evaporation of a liquid, which may cause the pores of the dielectric encapsulant (e.g., the aerogel) to collapse, thereby substantially increasing the density and the dielectric constant of the resultant dielectric encapsulant. Additionally, vapor deposition is capable of sealing pores of various sizes and accommodates complex geometries, while providing good thickness uniformity and conformal coverage. Any suitable vapor deposition process available in the art may be used for forming the capping layer. A suitable vapor deposition process does not significantly etch or damage the dielectric encapsulant, which could potentially occur with some plasma-assisted vapor deposition processes.

The electronic device further includes the barrier layer on the capping layer. For example, at least a portion of the capping layer is between the barrier layer and the substrate. In some embodiments, the barrier layer overlaps at least a portion of the substrate surrounding the perimeter of the capping layer to substantially seal or hermetically seal the exposed surface and edges of the capping layer. The barrier layer may include an inorganic material or a composite of organic and inorganic materials that form a water impermeable layer and the barrier layer may seal surfaces and edges of the capping layer to prevent or reduce the penetration of water through the capping layer and/or along the interface between the capping layer and the impermeable substrate to the at least one electronic circuit component. As used herein, the term "inorganic material" refers to a coating material that does not contain carbon bonded to hydrogen and/or fluorine. Examples of inorganic materials of the present disclosure include those selected from metal oxides, metal alloys, metal carbides, metal nitrides, and mixtures thereof, which have low moisture absorption and permeability. The term "organic material" refers to a coating material the does contain carbon bonded to hydrogen and/or fluorine, including organometallic compounds, such as organosilicon polymers. Examples of organic materials of the present disclosure include polymers, such as parylenes, fluoropolymers, polysiloxanes, or combinations thereof. In some embodiments, water and, optionally, other contaminants pass through the barrier layer, if at all, at impurity levels that are undetectable and/or levels that do not substantially interfere with the operation and/or lifetime of the electronic circuit. As such, the barrier layer may hermetically seal the electronic device. For example, the dielectric encapsulant, the capping layer, and the barrier layer may form a hermetically sealed micro-cavity for sealing the electronic circuit. As used herein, in some embodiments, the term "hermetically sealed micro-cavity" refers to a micro-cavity formed over the sensitive component or region on the substrate with an internal free cavity volume of less than or equal to 0.002 cm$^3$ in which the steady state leak rate of moisture through the capping and barrier layers into the micro-cavity meets military standard (e.g., as specified in Mil-Std-750, Test Methods For Semiconductor Devices, Method 1071 (Hermetic Seal)) requirements for the equivalent standard fine leak rate limit (L) of less than or equal to $5 \times 10^{-10}$ atm-cc/sec expressed in terms of the volume of dry air that flows into the micro-cavity at 25° C. and with one atmosphere pressure differential between the micro-cavity interior and the exterior environment. In some embodiments, the hermetically sealed micro-cavity provides protection at the FET level, which may be one to two orders of magnitude smaller in volume than an equivalent metal or ceramic hermetic package that provides protection for the entire semiconductor chip and which may have an equivalent fine leak rate limit of less than, for example, $1 \times 10^{-7}$ atm-cc/sec (air) as specified in the Mil-Std-883, Method 1014 (Seal), for microelectronic packages with an internal free cavity volume of >0.05 cm$^3$ to ≤0.4 cm$^3$. Although the present disclosure is not bound by any particular mechanism or theory, it is believed that the equivalent standard leak rate limit decreases as the cavity volume decreases because the rate of partial pressure buildup of water vapor or other gases that leak into the cavity increases as the cavity volume gets smaller. Thus, the leakage and/or permeation of water vapor into the micro-cavity formed by the free volume within the dielectric encapsulant and sealed by the capping layer should be minimized or reduced using the barrier layer. In some embodiments, the leak rate of moisture into the hermetically sealed micro-cavity is minimized or reduced by selection of the barrier layer composition (including, for example, selection of metal oxides, metal alloys, metal carbides, metal nitrides, or mixtures thereof), layer structure (including, for example, single layers, bilayers, or nanolaminates of layers having different compositions), and thickness to control the moisture permeability of the barrier layer. The leak rate of moisture into the hermetically sealed micro-cavity is further minimized or reduced by setting the cavity size and/or corresponding available surface area of the barrier layer through which the gases may diffuse into the cavity formed by the dielectric encapsulant, as described further herein below. Permeation of liquids and/or gases into the cavity may also be minimized or reduced by, prior to depositing the barrier layer coating, reducing the number of defects per unit area (e.g., frequency of pores, voids, cracks, delamination, etc.) in the barrier layer by employing any suitable good handling practices and effective cleaning processes generally used in the art. For example, to ensure the substrate and capping layer surfaces are free (or substantially free) of particles or contamination and are properly activated, the surfaces may be rinsed with a condensing alcohol vapor to remove particles, baked to drive off residual solvent and/or moisture, and activated with a mild oxygen plasma or an oxygen/argon plasma mixture to provide reactive surface end groups (e.g., hydroxyls) on the substrate and capping layer surfaces for bonding of the barrier layer.

The leak rate of moisture through the barrier layer into the micro-cavity may be determined using various suitable test methods generally used in the art. Due to the small volume of the micro-cavities and the use of an organic material for the capping layer that has both permeability and solubility for gases, measuring the leak rate using military standard leak test methods, for example, using helium as a tracer gas, is complex. Suitable measurement techniques and analytical methods include using calibrated humidity sensors to measure the partial pressure buildup of water vapor within the micro-cavity and calculating the leak rate from theory or using dedicated water vapor transmission rate (WVTR) measurement equipment and services, for example, as available from MOCON Inc., to directly measure the permeation of water vapor through the barrier layer on the capping layer under accelerated conditions of temperature and humidity. Once the water vapor transmission rate of the barrier layer is measured, the equivalent leak rate for dry air into the cavity may be determined utilizing the surface area of the hermetically sealed micro-cavity formed by the dielectric encapsulant, the capping layer, and the barrier layer on the capping layer. While the present disclosure is not bound by any particular mechanism or theory, it is believed that the equivalent standard leak rate (L) of dry air into the micro-cavity may be determined from the steady state WVTR of the barrier layer, the micro-cavity surface area, and the partial pressure difference for water vapor across the barrier layer under the test conditions by the following Equation 1:

$$L = [WVTR \times (1/C) \times SA \times V_m \times \text{Sqrt}(m_{H2O}/m_{air})] / [m_{H2O} \times \Delta P] \quad \text{Equation 1}$$

Where: WVTR=measured steady state water vapor transmission rate for the barrier layer on the capping layer in grams/meter$^2$/day C=a unit conversion factor from days to seconds (86,400 seconds/day)

SA=surface area of the micro-cavity in meter$^2$ $V_m$=molar volume of water vapor in cubic centimeters at one atmosphere and at reference temperature of 25° C. (24,465.29 atm-cc)

$m_{H2O}$=molar mass of water (18.02 grams per mol)

$m_{air}$=effective molar mass of air (28.97 grams per mol)

ΔP=partial pressure difference for water vapor across the barrier layer under the test conditions (e.g., about 0.066 atm for an accelerated test environment at 40° C. and 90% relative humidity across the barrier layer film into a dry carrier gas)

In some embodiments, the surface area (SA) for the hermetically sealed micro-cavity of the present disclosure to meet the equivalent standard leak rate requirement (L) in dry air for a given barrier layer with a measured WVTR may be determined by rearranging Equation 1 above as follows to provide Equation 2, whereby the parameters in Equation 2 are the same as described for Equation 1:

$$SA = [L \times m_{H2O} \times \Delta P] / [WVTR \times (1/C) \times V_m \times \text{Sqrt}(m_{H2O}/m_{air})] \quad \text{Equation 2}$$

In embodiments that achieve hermeticity, the surface area (SA) of the hermetically sealed micro-cavity formed over the sensitive electronic circuit component may be determined according to Equation 2 using the measured WVTR of the barrier layer to meet an equivalent standard fine leak rate (L) requirement of less than $5 \times 10^{-10}$ atm-cc/sec (air) for a semiconductor device with an internal free volume of less than or equal to 0.002 cm$^3$. In some embodiments, the thickness of the micro-cavity is small compared to the length and width of the micro-cavity, such that the micro-cavity surface area is readily approximated by measuring the planar surface area projected by the dielectric encapsulant onto the substrate. In some embodiments, the volume of the micro-cavity may be determined from the projected surface area and thickness of the dielectric encapsulant, which, for a porous aerogel film, closely approximates the internal free volume of the cavity. In an embodiment, the WVTR of the barrier layer is less than or equal to 0.01 gram/meter$^2$/day when measured at 40° C. and 90% relative humidity, and the planar surface area of the hermetic micro-cavity is set by design to be less than $2.66 \times 10^{-7}$ m$^2$ to yield an equivalent standard fine leak rate (L) of less than $5 \times 10^{-10}$ atm-cc/sec (air) for a micro-cavity volume up to 0.002 cm$^3$. In another embodiment, the WVTR of the barrier layer is less than or equal to 0.002 gram/meter$^2$/day when measured at 40° C. and 90% ambient relative humidity, and the planar surface area of the hermetic micro-cavity is set by design to be less than $13.3 \times 10^{-7}$ m$^2$ to yield an equivalent standard fine leak rate (L) of less than $5 \times 10^{-10}$ atm-cc/sec (air) for a micro-cavity volume up to 0.002 cm$^3$. In a further embodiment, the WVTR of the barrier layer is less than or equal to 0.00005 gram/meter$^2$/day when measured at 40° C. and 90% ambient relative humidity, and the planar surface area of the hermetic micro-cavity is set by design to be less than $532 \times 10^{-7}$ m$^2$ to yield an equivalent standard fine leak rate (L) of less than $5 \times 10^{-10}$ atm-cc/sec (air) for a micro-cavity volume up to 0.002 cm$^3$. Therefore, according to certain embodiments of the disclosure, the surface area (SA) of the micro-cavity may be linearly proportional to the inverse of the WVTR according to Equation 2 and the size of the cavity increases linearly as the measured WVTR of the barrier layer decreases.

The WVTR test conditions for the barrier layer on the capping layer may be selected for ease and/or speed of testing purposes or to match expected "use" conditions in the field of application. While the WVTR of the barrier layer may be measured at 40° C. and 90% relative humidity for some embodiments, other temperature and humidity test conditions may also be selected, as is feasible according to the test equipment capability and capping layer material properties (e.g. thermal stability, glass transition temperature, etc.). When the measurement temperature of the WVTR for the barrier layer differs significantly from the previously defined reference temperature of 25° C. for the equivalent standard leak rate, however, the measured WVTR and corresponding leak rate at that measurement temperature could differ from the effective WVTR and leak rate at the reference temperature of 25° C. Indeed, the permeability of organic coatings, such as those that are suitable for the capping layer alone, may generally be expected to increase with temperature. The very low permeability of the inorganic barrier layer, however, is believed to dominate the WVTR of the capping and barrier layer stack and the permeability of the inorganic barrier layer may not be expected to vary significantly with temperature. Therefore, the WVTR for the capping\barrier layer stack, as measured at 40° C. or similar temperature above 25° C., is believed to provide a suitable (or conservative) approximation for the WVTR and the corresponding leak rate at a lower reference temperature, such as at 25° C. As an example, a micro-cavity having a surface area of approximately $1.2 \times 10^{-6}$ m$^2$ and a volume of approximately 0.00012 cm$^3$ was prepared on a face-up silicon integrated circuit according to an embodiment of the present disclosure, baked to dry out the cavity before applying the barrier layer, and then tested in a chamber at 25° C. and 95% relative humidity to simulate field conditions using a calibrated humidity sensor inside the micro-cavity. The WVTR of the barrier layer was previously measured to be less than 0.002 gram/meter$^2$/day (the lower detection limit of the available WVTR test equipment) at 40° C. and 90% relative humidity with a partial pressure difference of approximately 0.066 atm of water vapor across the barrier layer. The equivalent standard leak rate in air measured by the calibrated humidity sensor inside the micro-cavity at test conditions of 25° C. and 95% relative humidity (with a partial pressure difference of approximately 0.030 atm of water vapor) was approximately $3 \times 10^{-10}$ atm-cc/sec (air), which meets the $5 \times 10^{-10}$ atm-cc/sec (air) military standard reference limit for a semiconductor device with internal free volume of less than 0.002 cm$^3$. This measured leak rate is slightly below the leak rate of $4.5 \times 10^{-10}$ atm-cc/sec (air) calculated utilizing Equation 1 with the same area, but using the WVTR measured at 40° C. and 90% relative humidity. Therefore, the micro-cavity was demonstrated to be hermetic and Equation 1 was shown to be conservative when the WVTR of the barrier layer WVTR is measured under accelerated conditions.

Water vapor and other gases may also permeate into the micro-cavity through the barrier layer covering the top surface and edges of the capping layer around the perimeter of the micro-cavity, where the capping layer overlaps the impermeable substrate, and thereby provide a secondary path for diffusion into the micro-cavity. The transmission rate of any gas that diffuses along this path through the plane of the capping layer between the barrier layer and the impermeable substrate (for example, where the capping layer directly contacts the impermeable substrate to form the seal around the dielectric encapsulant), however, is believed to be significantly lower than the transmission rate through the primary diffusion path perpendicular (or substantially perpendicular) to the barrier layer over the micro-cavity formed by the dielectric encapsulant. Although the present disclosure is not bound by any particular mechanism or theory, it is believed that the cross sectional area available for diffusion through the plane of the capping layer between the barrier layer and the impermeable substrate is reduced by the relatively small thickness of the capping layer and is thus significantly smaller than the surface area available for diffusion over the micro-cavity formed by the dielectric encapsulant. Therefore, the diffusion rate through this secondary path is not explicitly accounted for in the leak rate equations of Equation 1 and Equation 2.

In applications where the capping layer may be exposed to wet processing during assembly, such as post-flip chip attachment flux cleaning, it has been found that process liquids, such as heated deionized water, solvents, and aqueous or semi-aqueous based flux cleaning agents, can attack the interface between the capping layer and the impermeable substrate, thereby initiating a loss of adhesion or delamination of the capping layer seal and causing gross leaks to form in the micro-cavity. In embodiments, it has been demonstrated that applying the barrier layer on top of the capping layer and on the substrate to form the hermetically sealed micro-cavity before any subsequent exposure to wet processes or environments occurs may seal off and protect the interface between the capping layer and the substrate, thereby preventing (or reducing the likelihood of) the loss of adhesion or delamination of the capping layer that would otherwise occur.

The substrate may include any of a variety of suitable circuit boards available in the art, including without limitation, integrated circuits, semiconductor wafers and/or singulated semiconductor devices, bumped flip chip wafers and/or singulated bumped flip chip devices, thin film networks, printed circuit boards, printed wiring boards, hybrid boards, and the like. Further, the substrate may include circuit assemblies, including without limitation, hybrid microelectronic circuit assemblies, multi-chip modules, chip-on-board assemblies, chip-and-wire assemblies, flip chip assemblies, ceramic chip carrier assemblies, plastic molded package assemblies, and the like.

A cross-sectional view showing a portion of an embodiment of an electronic device 100 (e.g., a face-up module-less chip) is shown in FIG. 1. The electronic device 100 includes a sensitive component or region 12 (e.g., an electronic circuit) on a substrate 14, which may include, for example, silicon (Si), gallium arsenide (GaAs), gallium nitride (GaN), silicon germanium (SiGe), silicon carbide (SiC), indium phosphide (InP), alumina, beryllium Oxide (BeO), and/or aluminum nitride (AlN) such that the substrate is water impermeable. Non-limiting examples of the electronic circuit (e.g., a sensitive component or region) include a field-effect transistor ("FET"), a FET containing region, a through-hole, a wave guide, a via, an air bridge, a bond wire, a solder joint, a transmission line, an inductor, a conductor, a capacitor, a filter, a delay line, a coupler, a resonator, an impedance matching network, an attenuator, a resistor, a switch, and/or a circulator. A dielectric encapsulant 16 covers at least a portion of the electronic device 100, including the sensitive component or region 12 and, optionally, any other sensitive components or regions of the electronic device 100. The dielectric encapsulant 16 may be an aerogel with dielectric constant less than about 1.5 and a loss tangent less than about 0.010 at X-band frequencies or higher (e.g., 8 to 12 GHz, or higher). In embodiments that achieve hermeticity, the area of the substrate 14 covered by the dielectric encapsulant 16 may further be controlled such that the sensitive component or region 12 is suitably encapsulated by the dielectric encapsulant 16 (e.g., the sensitive component or region is substantially covered by the dielectric encapsulant layer such that little or no portion of the sensitive component or region is visibly exposed), but such that the surface area does not exceed the surface area corresponding to the desired equivalent standard leak rate calculated utilizing Equation 2 and the thickness of the dielectric encapsulant may be controlled such that the micro-cavity volume is less than or equal to 0.002 cm$^3$. The remaining portion of the electronic device 100 may be substantially free of the dielectric encapsulant and may include areas that remain open for electrical interconnections to be formed, for example, wire bond pads, probe pads, ground pads, signal pads, solder bumps, and the like. In the accompanying drawings, including FIG. 1, a single contact angle between the dielectric encapsulant 16 and the substrate 14 may be shown for ease of depiction. The contact angle, however, is not limited to that shown in the drawings. On the contrary, the contact angle between the dielectric encapsulant 16 and the substrate 14 may be any suitable contact angle.

The electronic device 100 further includes a capping layer 18 (e.g., a dense polymer layer) on the dielectric encapsulant 16 and substrate 14 to seal the pores of the dielectric encapsulant, provide mechanical integrity, and to provide environmental protection during subsequent processing and use. Additionally, a barrier layer 20 (an inorganic or composite organic/inorganic layer) having low moisture permeability is included on the capping layer 18 and on the substrate 14, to provide a hermetically (or near-hermetically) sealed cavity and adhesion layer for subsequent coatings and/or underfill. The capping layer 18 provides a smooth, dense, and substantially void-free foundation for the barrier layer 20. The barrier layer 20 provides a water vapor barrier to protect the sensitive components or regions from liquid moisture, water vapor, and/or other gases (e.g., oxygen). The barrier layer 20 may also protect the capping layer 18 from delaminating at the interface with the substrate 14 during subsequent wet processes and provides a surface having functional sites (e.g., hydroxyl groups) for subsequent bonding of coatings and underfills to the capping layer 18, which otherwise may exhibit low surface energy and poor bondability. In some embodiments, the barrier layer 20 and the capping layer 18 are formed on the dielectric encapsulant 16 and substrate 14 after final assembly of the electronic device including the dielectric encapsulant. The electronic device 100 further includes electrical interconnections 21 that are free (e.g., substantially or completely free) of the capping layer 18 and the barrier layer 20. In some embodiments, the electrical interconnections 21 are formed during final assembly of the electronic device and the capping layer 18 and/or the barrier layer 20 are formed on the exposed portions of the substrate 14, the dielectric encapsulant 16, the formed electrical interconnections 21, and on top of other components (for example, passive surface mount chip components, including capacitors, resistors, etc.) elsewhere on the assembly to further provide assembly-level environmental protection.

Figure 2:
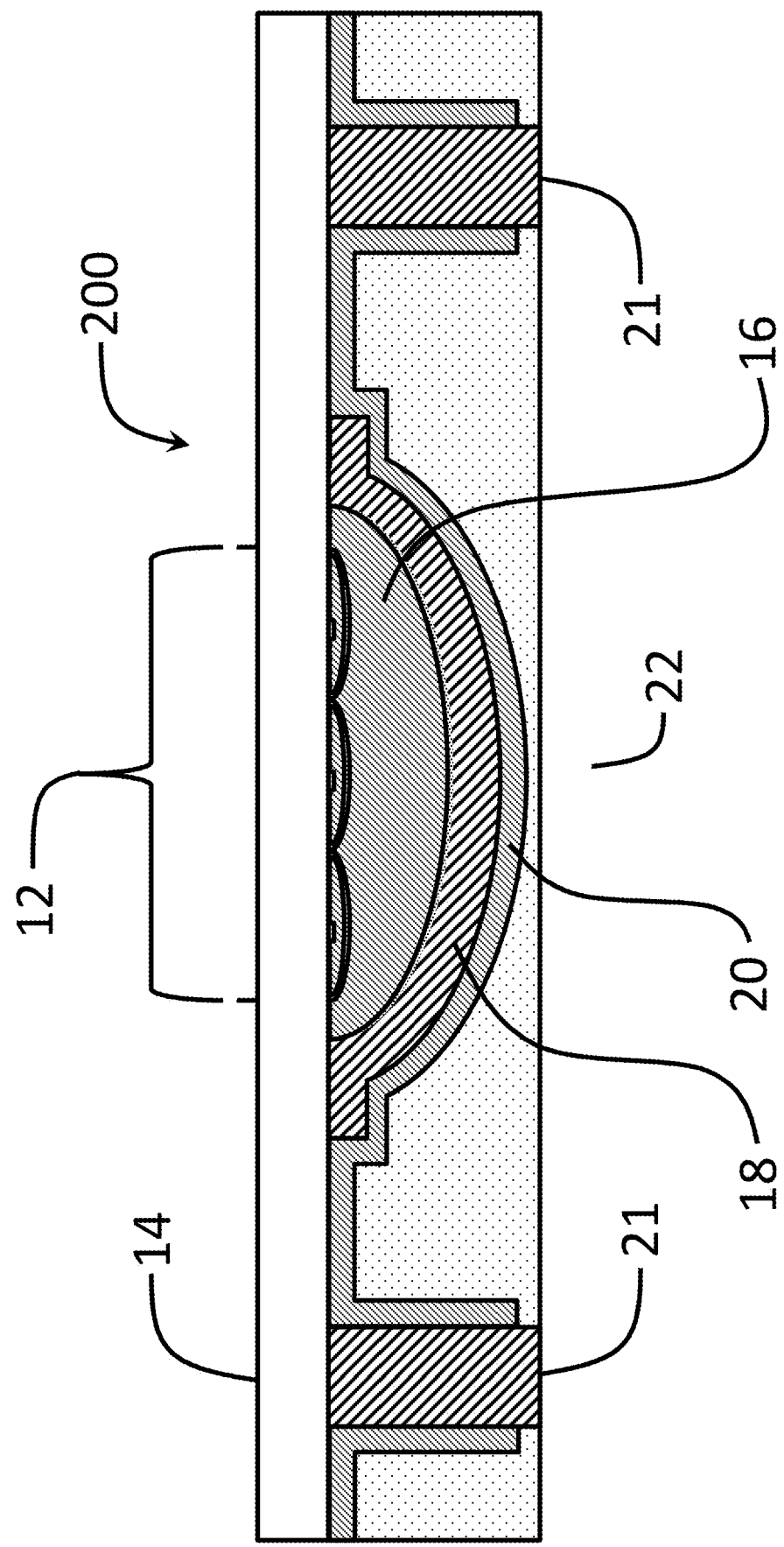
FIG. 2 is a cross-sectional view of a portion of another embodiment of an electronic device.

The electronic device of the present disclosure, however, is not limited to a "face-up" configuration of FIG. 1. For example, FIG. 2 is a cross-sectional view of a portion of an electronic device 200 (e.g., a "flip chip" device) including the sensitive component or region 12 on the substrate 14, and the dielectric encapsulant 16 on the sensitive component or region 12. The electronic device 200 further includes an underfill 22 on the dielectric encapsulant 16 and on the substrate 14. The underfill 22 may include any suitable underfill available in the art (e.g., Hysol FP-4531, Hysol FP-4546, and/or Hysol FP-4511, each available from Henkel, Namics 8437-2 and/or 8410-99 available from Namics Corporation, and/or Zymet CN-1533, available from Zymet). The remaining portion of the electronic device 200 is free (or substantially free) of the dielectric encapsulant and may include areas that remain uncoated for electrical interconnections to be formed, for example, for flip chip solder joints, wire bonds, pinned connections, and the like to be formed, and/or to provide direct attachment between the underfill and chip surface for mechanical integrity. In embodiments that achieve hermeticity, the area of the substrate 14 covered by the dielectric encapsulant 16 may further be controlled such that the sensitive component or region 12 is suitably encapsulated by the dielectric encapsulant 16 (e.g., the sensitive component or region is substantially covered by the dielectric encapsulant layer such that little or no portion of the sensitive component or region is visibly exposed), but such that the surface area does not exceed the surface area corresponding to the desired equivalent standard leak rate calculated utilizing Equation 2 and the thickness of the dielectric encapsulant may be controlled such that the micro-cavity volume is less than or equal to 0.002 cm$^3$. The electronic device 200 further includes the capping layer 18 and the barrier layer 20 between the dielectric encapsulant 16 and the underfill 22 and/or between the substrate 14 and the underfill 22. The electronic device 200 also includes the electrical interconnections 21 that are free (e.g., substantially or completely free) of the capping layer 18 and the barrier layer 20. In some embodiments, the electrical interconnections 21 are formed during final assembly of the electronic device 200, and after flip chip attachment, but before the underfill 22 is applied, the barrier layer 20 is deposited on the exposed portions of the substrate 14, the dielectric encapsulant 16, the capping layer 18, the formed electrical interconnections 21, and on top of other components (for example, a surface mount capacitor) that may be exposed elsewhere on the assembly to provide assembly-level environmental protection. In another embodiment, the barrier layer 20 may include multiple layers, with a first layer applied on the electronic device 200 before flip chip attachment such that the sensitive component or region 12, dielectric encapsulant 16, and the capping layer 20 are protected from attack during flip chip assembly and solder flux cleaning operations, while an additional layer (or layers) may be applied after flip chip attachment, but before the underfill 22 is applied, to protect the formed electrical interconnections 21 and other components, as described herein above.

In some flip chip embodiments, the thickness of the micro-cavity on the sensitive region 12, including the dielectric encapsulant 16, capping layer 18, and the barrier layer 20, may further be controlled to be less than the height of the formed electrical interconnections 21 (e.g., less than the reflowed flip chip solder joint height) to prevent or reduce interference between the capping layer 18 and/or barrier layer 20 on the micro-cavity and the opposing flip chip mounting substrate surface when forming the electrical interconnections 21. For example, the micro-cavity thickness may be selected to allow a clearance of about 10 μm or greater between the capping layer 18 and/or barrier layer 20 over the micro-cavity and any opposing layers on the flip chip mounting substrate surface (e.g., solder mask, printed features, coatings, metallization, etc.) to account for the effects of any thermal expansion that may occur when assembling the electronic device 200. Sufficient or suitable clearance is provided between the micro-cavity surface and opposing flip chip mounting substrate surface to prevent or reduce "standoff" of the electronic device 200 and to avoid or reduce the occurrence of open or poorly attached flip solder joint interconnections due to missing or incomplete contact between the flip chip bumps on the electronic device 200 and the opposing flip chip mounting substrate pads during final assembly.

Figure 3:
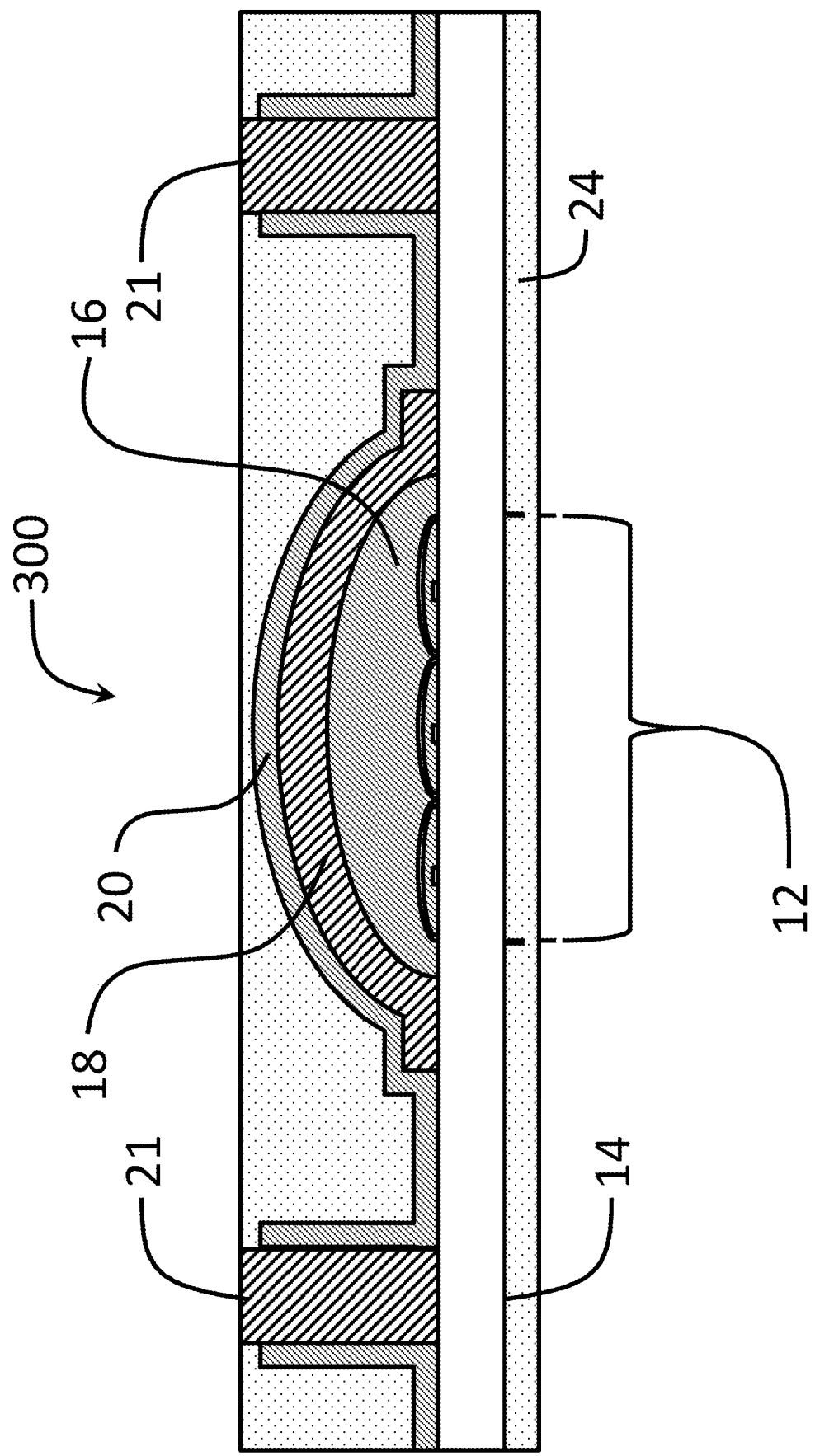
FIG. 3 is a cross-sectional view of a portion of another embodiment of an electronic device.

The electronic device may also be encapsulated in a polymer. For example, FIG. 3 is a cross-sectional view of a portion of an electronic device 300 at least partially encapsulated in a polymer 24 (e.g., a plastic molding compound, a potting compound, a glob top encapsulant, a conformal coating, a dam and fill material, or a combination or mixture thereof). The polymer 24 may include, for example, a liquid crystal polymer, an acrylic, an epoxy or silicone-modified epoxy, a silicone, a polyurethane, a benzocyclobutene (BCB), a polyimide or silicone-modified polyimide, a parylene, a perfluoroether, a polyamide, a polyamide-imide, a fluoropolymer, a phenolic resin, a polyarylate, a polysulfide, a polyetherketone, a polyethersulphone, a polyetherimide, a polyphenylene ether, a polycyclicolefin, a butadiene-styrene, or a combination or mixture thereof. The electronic device 300 further includes the sensitive component or region 12, the substrate 14, and the dielectric encapsulant 16. The electronic device 300 further includes the capping layer 18 and the barrier layer 20 between the dielectric encapsulant 16 and the polymer 24. The electronic device 300 also includes the electrical interconnections 21 that are free (e.g., substantially or completely free) of the capping layer 18 and the barrier layer 20. In embodiments that achieve hermeticity, the area of the substrate 14 covered by the dielectric encapsulant 16 may further be controlled such that the sensitive component or region 12 is suitably encapsulated by the dielectric encapsulant 16 (e.g., the sensitive component or region is substantially covered by the dielectric encapsulant layer such that little or no portion of the sensitive component or region is visibly exposed), but such that the surface area does not exceed the surface area corresponding to the desired equivalent standard leak rate calculated utilizing Equation 2 and the thickness of the dielectric encapsulant may be controlled such that the micro-cavity volume is less than or equal to 0.002 cm$^3$. In some embodiments, the electrical interconnections 21 are formed during final assembly and the capping layer 18 and/or the barrier layer 20 is formed on the exposed portions of the substrate 14, the dielectric encapsulant 16, the formed electrical interconnections 21, and on top of other components elsewhere on the assembly and/or package before the polymer 24 is applied to further provide assembly-level environmental protection. The low cost plastic encapsulated package of FIG. 3 may be utilized when sensitive FETs are protected from dielectric loading by a molding compound and/or glob top encapsulant. Further, the dielectric encapsulant 16 may cover and protect other sensitive elements in the assembly and/or package, such as bond wires, solder joints, and the like.

The capping layer may include any suitable polymer generally available in the art (e.g., a parylene such as, for example, Parylene N (unsubstituted linear poly(para-xylylene)), Parylene C (poly-monochloro(para-xylylene)), Parylene D (poly-dichloro(para-xylylene)), Parylene HT® (poly(para-xylylene)) having the alpha hydrogen atoms substituted with fluorine atoms), or Parylene VT4 (poly(para-xylylene)) having the four hydrogen atoms bonded to the aromatic ring substituted with fluorine atoms), and the like; a fluoropolymer, such as polytetrafluoroethylene (PTFE) and the like; or a polysiloxane (silicone), such as polydimethylsiloxane (PDMS), and the like) and the capping layer may be formed utilizing any suitable methods generally available in the art. For example, the capping layer may be vapor-deposited on the dielectric encapsulant (e.g., by way of chemical vapor deposition (CVD), initiated chemical vapor deposition (iCVD), plasma-enhanced chemical vapor deposition (PECVD), physical vapor deposition (PVD), plasma polymerization, vapor deposition polymerization (VDP), vapor-phase polymerization (VPP), or molecular layer deposition (MLD)). In some embodiments, the capping layer includes Parylene C, Parylene HT®, and/or Parylene D. In addition to good commercial availability, these polymers have good absorption in the ultraviolet (UV) spectrum below a wavelength of about 266 nanometers and enable patterning by photo-chemical ablation using fast and highly-automated UV laser technology, such as excimer and solid-state pulsed laser systems.

Embodiments of the dielectric encapsulant (e.g., aerogel film) may have pore size distributions in the mesoporous range (e.g., in the range from about 2 to about 50 nanometers) with occasional macropores (e.g., pores with smallest dimension greater than about 50 nanometers in length) according to IUPAC classifications. While the pores that are only a few nanometers in diameter may be readily sealed by even a relatively thin capping layer, pores that are in the macroporous range may be more difficult to fill. Vapor-deposition processes that are available in the art may be highly conformal, may have high capillary penetration capability, and thus may have the tendency to coat inside the body of the dielectric encapsulant before the surface macropores are effectively sealed. In some embodiments, the polymer (e.g., parylene) of the capping layer may diffuse into the dielectric encapsulant during vapor deposition and may alter, for example, the aerogel density and dielectric constant in a diffusion zone of the dielectric encapsulant. To prevent or reduce such alteration and degradation, in some embodiments, a surface of the dielectric encapsulant and substrate is pretreated with an energetic, inert plasma treatment (e.g., by ion bombardment with Ar plasma) to increase the surface density of the dielectric encapsulant and to substantially or significantly reduce diffusion of the polymer into the dielectric encapsulant, while also cleaning the aerogel-free areas of the substrate surface to enhance adhesion of the capping layer, without or substantially without damaging the surrounding dielectric encapsulant. The gaseous species, RF power, gas pressure, and duration of the plasma exposure may be selected to increase or decrease the densifying effect on the aerogel surface. In another embodiment, the dielectric encapsulant is baked prior to coating with the capping layer to remove absorbed moisture or residual solvent, such that a low dielectric constant is maintained and the risk of blistering of the capping layer is reduced when exposed to elevated temperatures during subsequent assembly level processing (e.g., solder reflow).

For a vapor-deposited capping layer process, the depth of the polymer diffusion zone and the deposition time required for substantially void-free pore sealing of the dielectric encapsulant may also be reduced by selecting a capping layer chemistry having both high deposition rate capability and low capillary penetration capability. The deposition process parameters including, for example, the deposition chamber pressure, chamber temperature, and substrate temperature may be varied to increase deposition rate, but capillary penetration capability also depends on the monomer structure selected for the capping layer material. In some embodiments, the monomer structure selected for the polymer of the capping layer is any suitable parylene (e.g., poly(para-xylylene)) with atoms substituted for a hydrogen on the aromatic benzene ring. For example, the parylene may have a bulky atom or atoms substituted for a hydrogen on the aromatic benzene ring (e.g., aromatic-substituted parylenes including one substituted chlorine atom such as, for example Parylene C (polypara-(chloroxylylene)), or including two substitute chlorine atoms such as, for example, Parylene D (poly(para-dichloroxylylene)). Without being limited by any particular mechanism or theory, it is believed the molecular weight, molecular structure, and/or surface reactivity (e.g., the sticking coefficient and polymerization rate constant) of the aromatic-substituted parylene monomers having bulky atoms favor rapid condensation and polymerization within the pores at the surface of the dielectric encapsulant such that the pores are sealed before substantial penetration of the monomer into the body of the dielectric encapsulant can occur. Moreover, Parylene C and Parylene D have good commercial availability, shorter deposition time to achieve a suitable thickness on the dielectric encapsulant, and lower water vapor transmission rate as compared to other vapor-deposited polymers, such as, for example, Parylene N, Parylene HT®, and the like. Applications that involve long term exposure to high temperature in air (e.g., temperatures above 100° C.) or brief excursions to higher peak temperatures during processing (e.g. solder reflow temperature), however, may use a capping layer having high thermal stability, such as Parylene HT® or Parylene VT4, by itself or in combination with another pore-sealing polymer, such as Parylene C. Due to the higher capillary penetration of the Parylene HT® or Parylene VT4 monomers, the aforementioned inert plasma treatment (e.g., by ion bombardment with an Ar plasma to increase the surface density) and/or the polymer deposition parameters (e.g., chamber pressure during deposition) may be tuned to reduce the amount of polymer diffusion into the dielectric encapsulant when Parylene HT® and/or Parylene VT4 monomers are deposited without first applying another pore-sealing polymer (e.g., Parylene C or Parylene D).

The capping layer having low water vapor transmission rate and low moisture absorption helps to protect sensitive electronic components from corrosion due to exposure to humidity during processing and use in the field. In an embodiment, the water vapor transmission rate of the capping layer is less than about 4 gram/meter$^2$/day when measured having a thickness equal to approximately 25 μm at 37° C. and 90% relative humidity and the absorption of water in the polymer is <1% by weight after 24 hours of immersion at room temperature. In some embodiments, the low water vapor transmission rate of the capping layer alone may not be suitable or sufficient to provide a hermetic micro-cavity. Indeed, the capping layer may still be permeable and may allow water vapor and/or other gases to enter and exit the micro-cavity at rates that could allow the cavity atmosphere to reach equilibrium with the ambient environment significantly faster than a hermetic micro-cavity including the barrier layer of embodiments of the present disclosure would. A permeable capping layer, however, allows water vapor and/or other gases to be removed or substantially removed from the micro-cavity and/or dielectric encapsulant through the capping layer before the barrier layer is applied, for example, by baking or storage in vacuum or a dry atmosphere for a period of time.

The capping layer may be of suitable thickness to form a substantially void-free layer to substantially seal the pores of the dielectric encapsulant against seepage by liquid or gaseous contaminants into the micro-cavity. The capping layer may have a thickness of approximately 1 μm to 25 μm, 4 μm to 6 μm, or 8 μm to 10 μm. Below 1 μm of thickness, the capping layer may not substantially seal the pores at the surface of the dielectric encapsulant and pinhole voids may be likely to occur. As the capping layer thickness approaches 25 μm, pinhole voids are unlikely, but the deposition time for the capping layer may be very long, more frequent cleaning of deposition equipment may be required, material cost may be high, patterning of the polymer coating may be slow or difficult, and the increase in part dimensions (e.g. length, width, or thickness) may cause interference with other components. Further, residual stresses in the capping layer due to the coefficient of thermal expansion (CTE) mismatch between the capping layer and the substrate may become significant as the thickness of the capping layer increases and may cause cracking and/or delamination. A thicker capping layer may also have increased cross sectional area and may allow more rapid diffusion of gasses in the plane of the capping layer than a thinner capping layer would. In some embodiments, a suitable capping layer thickness may be achieved when no or substantially no solvent diffusion is observed into the capped dielectric encapsulant and no or substantially no streams of bubbles are observed leaking out of the capped dielectric encapsulant over a period of time (e.g., one to five minutes) after the substrate is submerged in a shallow bath (e.g., to a depth of about 5 mm) of a low viscosity liquid, such as, for example, water, methanol, ethanol, isopropyl alcohol, acetone, or a colored (e.g., red colored) or fluorescent dye penetrant, and/or mixtures thereof. If patterning of the capping layer is required or desired, for example, by laser ablating open areas on the substrate surface for electronic connections or to enhance attachment area for subsequent coatings or underfill, the aforementioned inspection with the substrate submersed under liquid may be performed after the patterning step has been completed to ensure that the process has not (or substantially has not) initiated any leaks or delamination and to ensure that the width of the capping layer seal remaining on the substrate surface is suitable to protect the dielectric encapsulant against seepage by liquid into the micro-cavity. In embodiments, the width of the patterned capping layer seal around the micro-cavity formed by the dielectric encapsulant may be 25 μm to 250 μm, 25 μm to 50 μm, or 100 μm to 150 μm. A suitable capping layer material selection, thickness, and seal width may also be verified by exposing the capped device to the environmental stresses predicted during assembly, including solder reflow, flux cleaning, coating of the barrier layer, electrical test, and/or simulated use and ensuring that no (or substantially no) leaking, blistering, peeling, cracking, or delamination of the capping layer is observed on the micro-cavity and substrate surface due to thermal instability, residual stress, and/or loss of adhesion of the capping layer.

In some embodiments, the surface of the substrate having the dielectric encapsulant formed thereon is treated with a vapor-deposited organosilane coupling agent and/or adhesion promoter to enhance adhesion of the capping layer to the areas of the substrate not covered by the dielectric encapsulant. The vapor-deposition process allows uniform treatment of the exposed substrate surface with the coupling agent and provides good deposition of a few monolayers (e.g., 2 to 5 monolayers), without saturating or otherwise damaging the porous structure of the exposed dielectric encapsulant. In some embodiments, the vapor-deposited organosilane includes an aminoalkylsilane (e.g., 3-aminopropyltriethoxysilane), a chloroalkylsilane (e.g., ((chloromethyl)phenylethyl)trimethoxysilane), a vinyl silane (e.g., styrylethyltrimethoxysilane), a mercapto silane (e.g., (3-mercaptopropyl)triethoxysilane), a phosphino silane (e.g., 2-(diphenylphosphino)ethyl-triethoxysilane), a methacrylate silane (e.g., 3-methacryloxypropyltrimethoxysilane), a dipodal silane (e.g., bis(3-(triethoxysilyl)propyl) tetrasulfide), or mixtures thereof. The composition of the organosilane coupling agent and/or adhesion promoter selected may be based on the composition of the substrate surfaces (e.g., oxide, oxynitride, nitride, noble metal, etc.) that the capping layer is applied to and/or the choice of capping layer material (e.g., parylene, fluoropolymer, siloxane, etc.).

The barrier layer may be formed over the capping layer and may include a single inorganic layer or a nanolaminate including alternating layers of dense organic and/or inorganic materials having low water vapor absorption (e.g., <1% by weight) and low permeability (e.g., a low water vapor transmission rate). In some embodiments, the rate of water vapor transmission through the barrier layer on the capping layer is less than 0.01 grams/m$^2$/day, less than 0.002 grams/m$^2$/day, or less than 0.00005 grams/m$^2$/day, when measured at 40° C. and 90% relative humidity. The barrier layer may be formed using any suitable thin film deposition method available in the art (e.g., physical vapor deposition (PVD), chemical vapor deposition (CVD), plasma enhanced chemical vapor deposition (PECVD), atomic layer deposition (ALD), and/or the like). In some embodiments, the barrier layer is deposited by ALD and the transmission rate of water through the barrier layer is less than 0.01 gram/meter$^2$/day at 40° C. and 90% relative humidity, the water absorption is less than 0.1% by weight at room temperature, the dielectric constant is between about 4 and about 110, the dielectric breakdown strength is greater than 2 million volts/cm, the thickness is between about 100 Angstroms and 2,000 Angstroms, and the volume resistivity is greater than $1\times10^{15}$ ohm-cm. Because the dielectric encapsulant and capping layer isolate the sensitive electronic component from the barrier layer, the dielectric constant of the barrier layer may be significantly higher than that of the dielectric encapsulant without or substantially without negatively impacting the performance of the device. For example, in some embodiments, the dielectric constant of the barrier layer may be between about 4 and about 10, between about 4 and about 14, or between about 4 and about 30. The water vapor transmission rate (WVTR) of the selected capping and barrier layers may be determined, for example, by measuring the WVTR of a polymer reference film, for example, Milenex ST504 (commercially available from DuPont Teijin Films U.S. Limited Partnership) at a set temperature and relative humidity condition before and after applying the capping and barrier layers at the desired thickness on the reference film. The WVTR may then be measured utilizing any suitable method generally used in the art using commercially available equipment from, for example, MOCON Inc., and the WVTR of the barrier layer may be determined using Fickian diffusion law equations and ideal laminate theory. Examples of suitable inorganic barrier materials include dielectrics, such as metal oxides, metal alloys, metal carbides, metal nitrides, and mixtures thereof (e.g., silicon dioxide, aluminum oxide, zirconium dioxide, hafnium dioxide, titanium dioxide, silicon carbide, silicon nitride, zinc oxide, beryllium oxide, tantalum oxide, and/or the like). In some embodiments, inorganic barrier materials having surface hydroxyls (e.g., metal oxides) are selected to provide a reactive surface for wetting and adhesion of subsequent organic materials, including, for example, underfills, encapsulants, and other conformal coatings. The barrier layer surface may be treated with a plasma (e.g., a reactive plasma, such as oxygen, an inert plasma, such as argon, or a mixture of the two) and/or ultraviolet (UV) ozone cleaning process prior to deposition of subsequent organic materials to enhance adhesion.

An organosilane coupling agent and/or adhesion promoter may be applied to the barrier layer to further enhance adhesion of the organic material. The organosilane coupling agent and/or adhesion promoter may comprise some of the same materials and methods as used for the capping layer, although a room-temperature liquid deposition process for these materials may also be suitable once the barrier layer has been formed. The organic materials include any suitable polymer generally available in the art (e.g., a parylene) and may comprise some of the same materials and methods as used for the capping layer.

In some embodiments, the capping layer and barrier layers may be applied at any stage after the dielectric encapsulant is formed on the substrate (e.g., at the chip, wafer, or assembly level; before or after final assembly of the encapsulated device) and may, optionally, be masked and/or selectively removed from surfaces on which a coating is not desired, for example, from electrical contacts (e.g., wire bond pads or flip chip bumps), thermal interfaces, ground planes, and/or the backside of components, by etching and/or ablating the capping layer and/or barrier layer while leaving the capped dielectric encapsulant patterned areas intact. The electronic device with dielectric encapsulant and capping layer may be baked to remove moisture from the micro-cavity and capping layer and/or treated with a plasma (e.g., a reactive plasma, such as oxygen, an inert plasma, such as argon, or a mixture of the two) and/or ultraviolet (UV) ozone cleaning process prior to deposition of the barrier layer to activate and/or roughen the surface of the capping layer to enhance nucleation and/or adhesion of the barrier layer. A suitable plasma or UV ozone treatment process will suitably or satisfactorily clean, activate, and/or roughen the surface of the capping layer, while avoiding excessive melting, oxidation, etching, chemical attack, and/or cracking of the capping layer surface. The capping layer is believed to be rapidly heated by contact with energized gas molecules in plasma due to the capping layer being thermally isolated from (e.g., not in direct physical contact with) the substrate in the areas where it covers the thermally insulating, low dielectric constant encapsulant. In some embodiments, the plasma treatment process includes brief exposure (e.g. 2 minutes or less) of the capping layer to a direct plasma, downstream plasma, and/or ion-free plasma under moderate conditions (e.g., a downstream oxygen plasma at an RF power of 250 Watts or less and gas pressure of 200 to 300 millitorr) to minimize or reduce the risk of overheating. Any suitable method available in the art, such as wetting contact angle measurements and water-break tests, may be utilized to determine when the capping layer surface is suitably or satisfactorily clean and activated, while optical inspection may be performed to ensure there is no melting, cracking, or discoloration.

Figure 4:
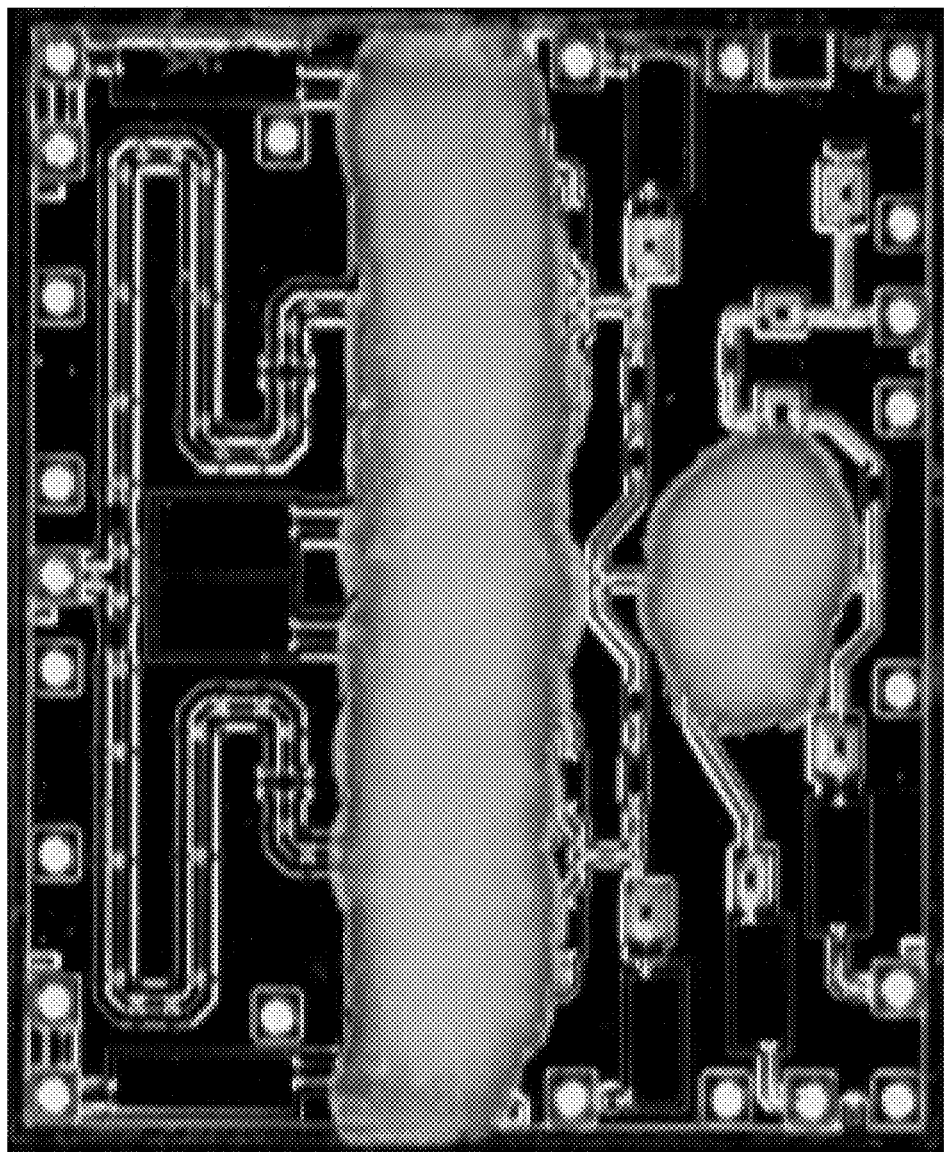
FIG. 4 is an image showing an embodiment of a capping layer including a polymer on a patterned aerogel film.
Figure 5:
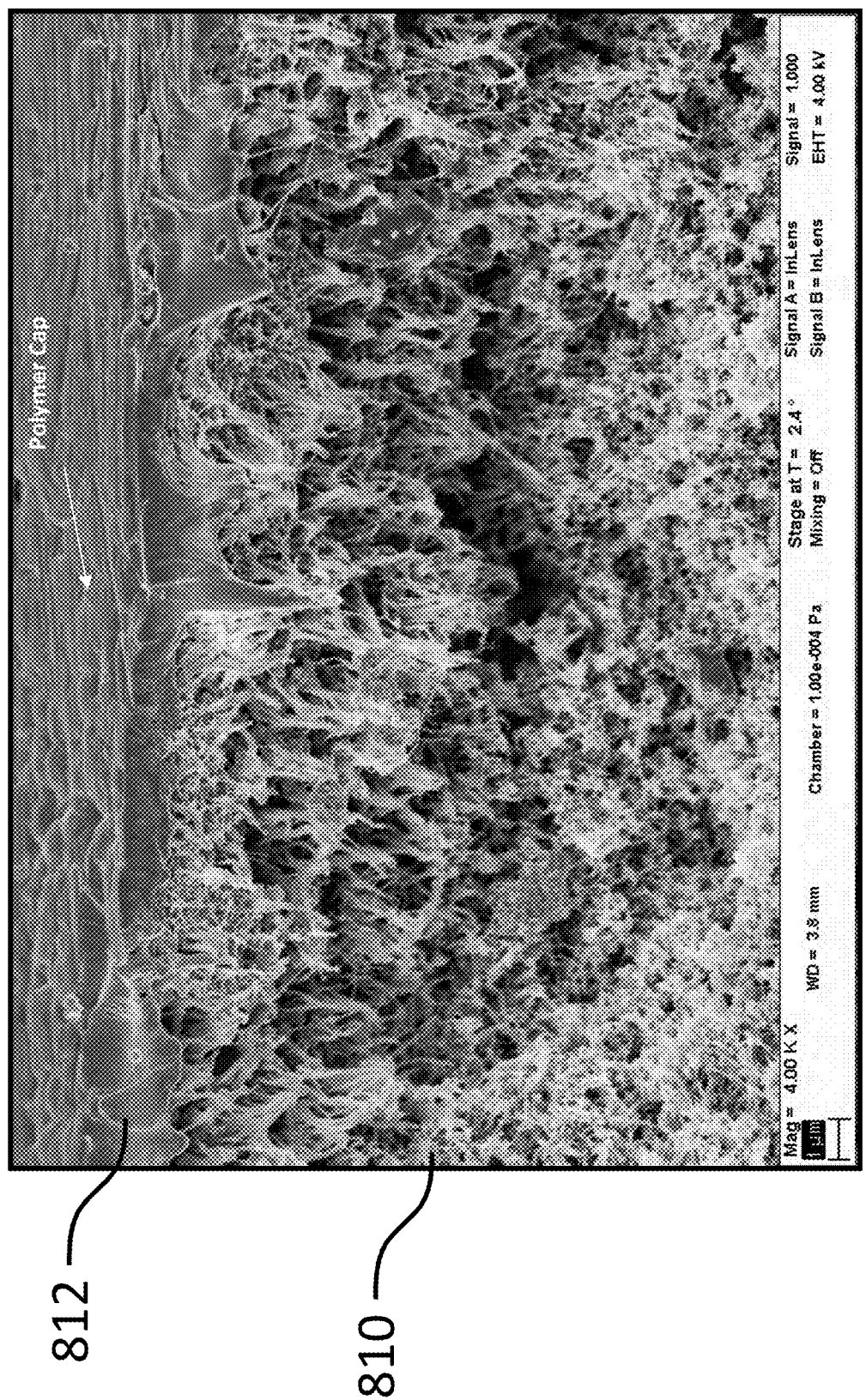
FIGS. 5 and 6 are scanning electron microscope (SEM) images of a sample including an embodiment of an aerogel film.
Figure 6:
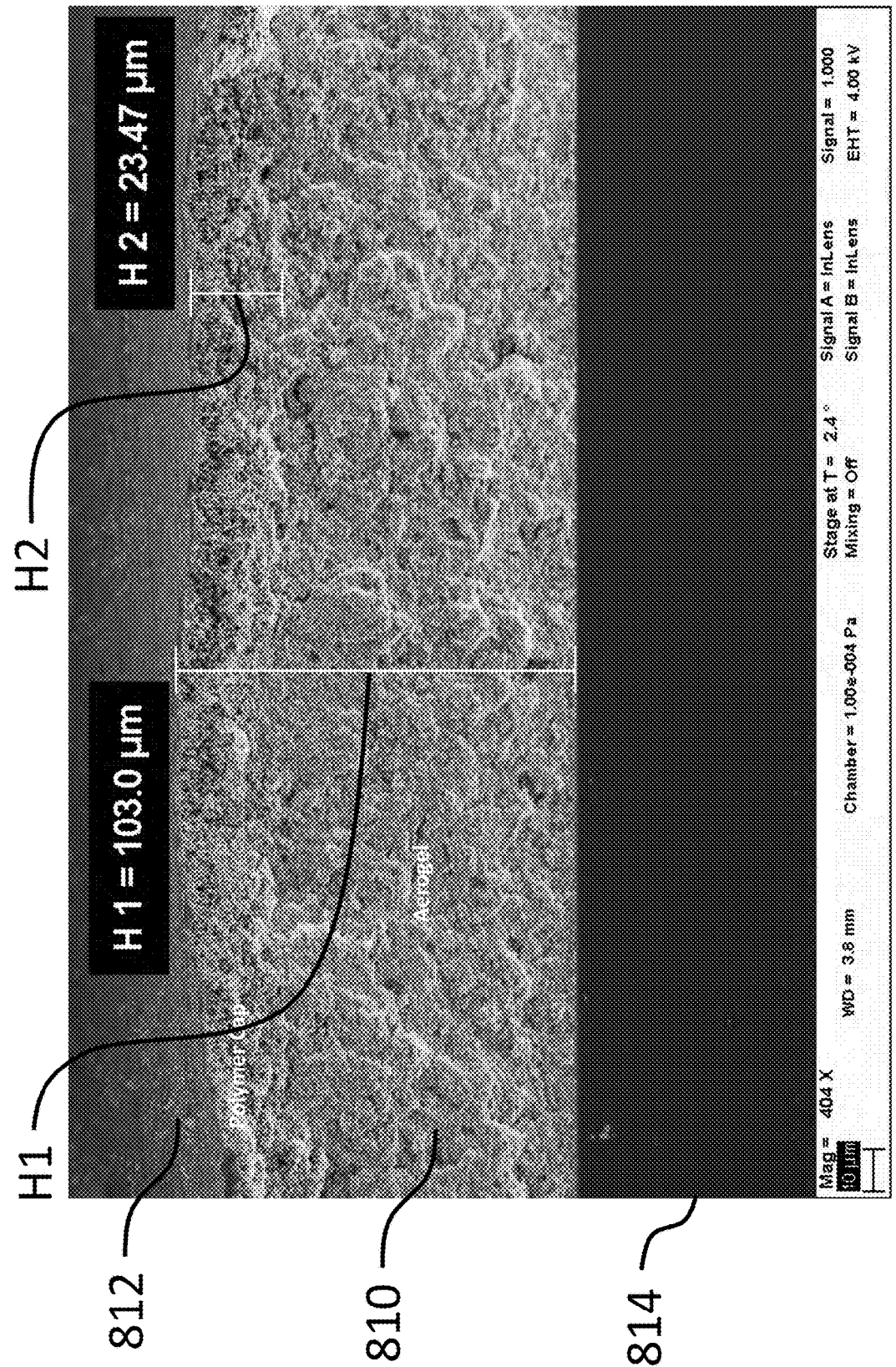

FIG. 4 is an image showing patterned aerogel films coated with a capping layer on a GaAs flip chip device according to an embodiment of the present disclosure. FIGS. 5 and 6 are scanning electron microscope (SEM) images of a sample prepared according to an embodiment of the present disclosure that has been cleaved to show an aerogel film 810 between a vapor-deposited capping layer 812 and a substrate 814. As can be seen in FIG. 6, the aerogel film 810 and the vapor-deposited capping layer 812 have a total thickness H1 of 103.0 µm, and the vapor-deposited capping layer 812 has diffused a distance H2 of 23.47 µm into the body of the aerogel film. The capping layer material in FIGS. 5 and 6 is Parylene HT® and has a thickness of about 1 µm. FIGS. 5 and 6 also show that the porous aerogel structure of the aerogel film is maintained after processing by capping with the capping layer.

In some embodiments, the diffusion distance of the capping layer into the body of the aerogel film can be substantially or significantly reduced by ion bombardment with inert plasma prior to vapor-deposition of the capping layer. For example, in one embodiment, a capping layer prepared using Parylene C without ion bombardment prior to vapor-deposition of the capping layer had a thickness of about 6.8 µm and the polymer of the capping layer had diffused a distance of about 15.25 µm into the aerogel film. In another embodiment, a capping layer prepared using Parylene C after ion bombardment of the aerogel film with an inert Ar plasma (for example, 5 minutes at an RF power of 200 Watts and Ar gas pressure of 280 millitorr) had a thickness of 8.79 µm and there was no observable diffusion of polymer of the capping layer into the aerogel film.

In another embodiment, selection of an aromatic-substituted parylene with a chlorine atom in place of a hydrogen atom on the aromatic ring for the capping layer may substantially or significantly reduce voiding in the capping layer, the deposition time, and the diffusion distance of the polymer into the body of the aerogel film. Indeed, in some embodiments, there are benefits of selecting aromatic-substituted Parylene C over aliphatic-substituted Parylene HT® with fluorine incorporated at the aliphatic sites for the polymer of the capping layer. The deposition time for Parylene C as a capping layer was about 4 hours, the capping layer thickness on the aerogel film was substantially uniform and greater than 6 µm, and the capping layer was void-free. In contrast, the deposition time with Parylene HT® as a capping layer in FIG. 6 was about 8 hours, the capping layer thickness was variable around about 1 µm, and pinhole voids were found in the capping layer.

In some embodiments, the dielectric encapsulant outside the region protecting the sensitive electronic component may be selectively removed or patterned after the dielectric encapsulant has been formed on the substrate to reduce the size and surface area of the micro-cavity as desired to meet the desired surface area calculated utilizing Equation 2 and to achieve the desired leak rate. The dielectric encapsulant may also be selectively removed or patterned to provide more area for direct attachment to the chip surface of other coatings, such as the polymer capping layer, the barrier layer, and/or a subsequent underfill, plastic molding compound, glob top encapsulant, etc. for enhanced mechanical integrity of the assembled device. In some embodiments, patterning is performed prior to deposition of the capping layer by using a dry patterning technique, for example, by laser ablation, which does not require exposing the porous dielectric encapsulant to wet chemicals, such as liquid photoresists, developers, strippers, or etchants. Suitable dry patterning processes do not allow liquids to contact the porous dielectric encapsulant (e.g., an aerogel), thereby avoiding contamination of the dielectric encapsulant and/or collapse of the pores due to the surface tension effect during evaporation of an absorbed liquid from the pores, which may substantially increase the density and the dielectric constant of the encapsulant. A patterned dielectric encapsulant may benefit from tailoring the selection of the capping process, deposition parameters, thickness, and material to ensure that the dielectric encapsulant is effectively sealed on the edges.

Additionally, a base layer may be deposited (e.g. by spin coating, laminating, vapor depositing, ALD coating, sputtering etc.) on the substrate prior to the formation of the dielectric encapsulant. For example, the base layer may be an intermediate dense, dielectric layer (e.g., permanent organic and/or inorganic dielectric layer and/or photoresist, including BCB, SU8, parylene, polyimide, $SiO_2$, $TiO_2$, $Al_2O_3$, and/or the like). The base layer may be selected from the same materials and processes disclosed for the capping layer and barrier layer, or combinations thereof, and may comprise multiple layers. In some embodiments, the base layer further comprises a relatively thin (e.g., less than or equal to about 2,000 Angstroms thick) inorganic dielectric barrier layer so as to minimize or reduce dielectric loading, and which has low moisture permeability and absorption to protect sensitive electronic components from the deleterious effects of water vapor and other detrimental liquid, gaseous, or solid contaminants that may penetrate the micro-cavity during processing or use in the field. When dielectric loading is not a concern, the thickness of the inorganic base layer may be substantially greater to further improve the moisture barrier performance. Although the moisture barrier performance of an inorganic base layer typically improves as the thickness is increased, there may be a "critical thickness" at which barrier performance no longer improves despite further increases in thickness. For example, an upper end of a range for the critical thickness may be determined by gradually increasing the thickness of the base layer until the barrier performance begins to drop off due to excessive stress, loss of adhesion, and/or cracking. The same approach may be employed to select the thickness of the barrier layer that is applied over the capping layer. In some embodiments, the inorganic base layer thickness may be selected from the range of about 100 Angstroms to about 2,000 Angstroms and the material composition may be selected to improve the balance between residual stress, dielectric loading, and/or moisture barrier performance for a given application. For example, the base layer may be selected to comprise a mixture or alternating layers of materials (e.g., a nanolaminate of aluminum oxide and silicon dioxide) to provide a better CTE match with the substrate and/or the capping layer, to provide lower moisture permeability, and/or to provide lower intrinsic stress than a coating of equivalent thickness formed from a single composition. Further, the base layer deposition parameters (e.g., deposition rate and temperature) may be selected to reduce stress in the coating while maintaining good barrier performance at a suitable thickness. The inorganic dielectric barrier layers described herein and/or any other suitable dielectric available in the art may be utilized with these embodiments.

In some embodiments, the electronic devices including the dielectric encapsulant may be exposed to argon plasma, treated with a silane coupling agent, and coated with Parylene C to yield the capping layer. The capping layer may be ablated from the tips of the bumps and portions of the chip surface using a laser and flip chips having a pattern of an encapsulated aerogel may then be ready for flip chip assembly. The flip chip including dielectric encapsulant and capping layer may be coated with the barrier layer before or after flip chip assembly. If applied before flip chip assembly, the barrier layer may be applied over a patterned capping layer and then ablated from the flip chip bumps to yield a flip chip device having a hermetic micro-cavity that exhibits good resistance to in-line flux cleaning processes and is ready for flip chip assembly.

Figure 7:
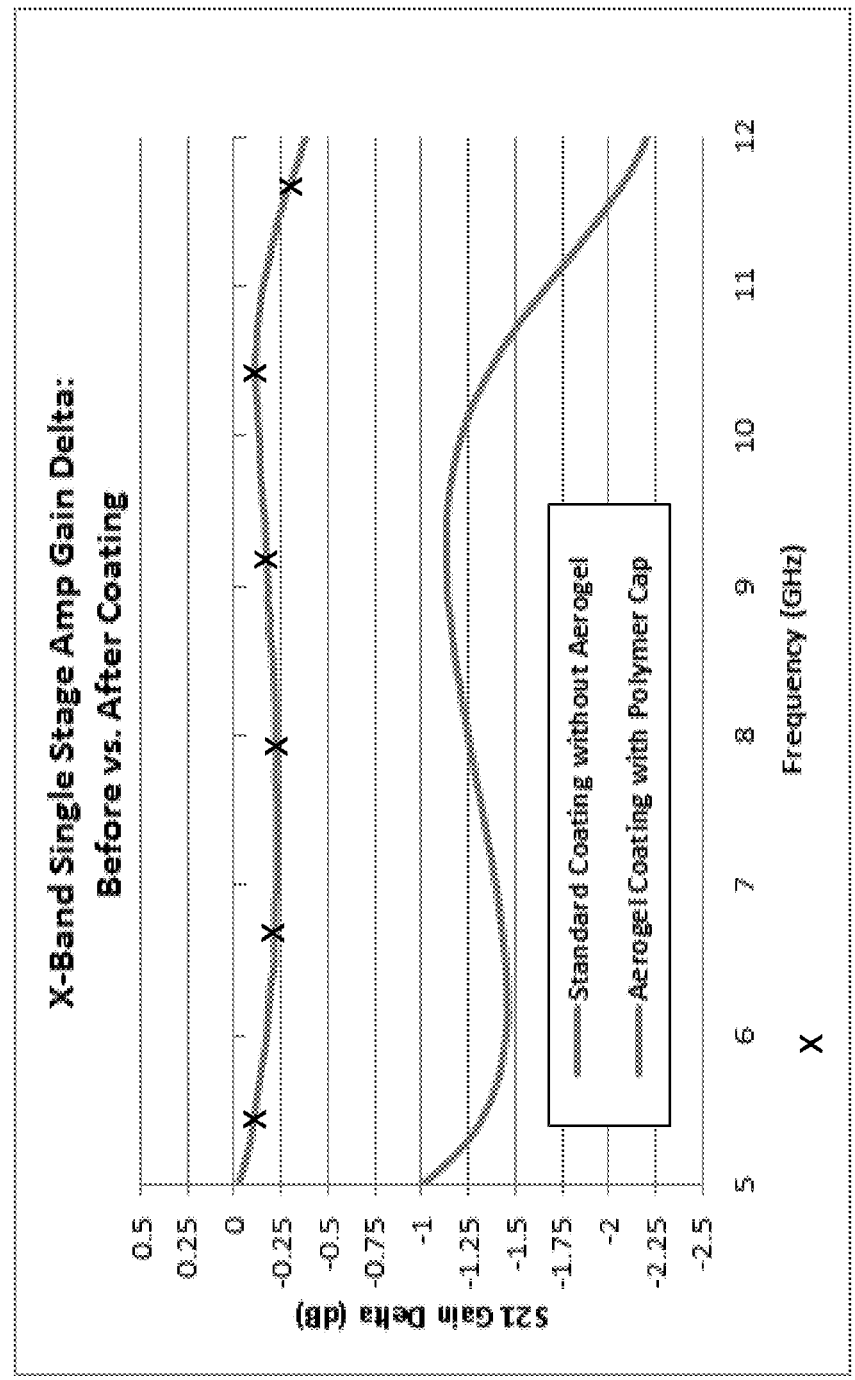
FIG. 7 is a graph showing results of RF testing of an X-band stage amp with and without an embodiment of a capping layer including a polymer on an aerogel film.

Face up X-band single stage amps on GaAs substrates were RF tested before and after being coated with a barrier layer in an embodiment including an aerogel film having a capping layer. The results are shown in FIG. 7. As can be seen in the graph of FIG. 7, the sample including the aerogel film and the capping layer exhibited a 0.18 dB average drop across the band, while a sample that did not include the aerogel film, exhibited a 1.38 dB average loss after application of the capping layer. In this embodiment, the GaAs surface further included a photoimageable BCB as a dense dielectric layer that was photo-patterned to expose openings over the sensitive FET's and electrical connection pads before applying the aerogel film and capping layer and/or barrier coating.

An embodiment of forming the electronic device includes securing a water impermeable substrate having at least one electronic circuit on the water impermeable substrate, forming a dielectric encapsulant on the electronic circuit, forming a capping layer comprising a polymer on the dielectric encapsulant, and forming a barrier layer on the capping layer, wherein the water impermeable substrate, the dielectric encapsulant, the capping layer, and the barrier layer form a hermetically sealed micro-cavity. The forming of the dielectric encapsulant may include patterning the dielectric encapsulant by laser ablating the dielectric encapsulant from the substrate in areas outside of the sensitive electronic circuit component or region. The forming of the capping layer may include vapor depositing the polymer on the dielectric encapsulant. Embodiments of the method may further include pretreating a surface of the dielectric encapsulant with a plasma treatment prior to the forming of the capping layer. The forming of the capping layer may also include patterning the capping layer by masking or laser ablating the polymer from the substrate in areas utilized for chip attachment, grounding, and/or electrical connections. The forming of the barrier layer includes depositing the barrier layer by atomic layer deposition on the patterned capping layer and on the substrate. Embodiments of the method may further include forming a base layer on the substrate prior to the forming of the dielectric encapsulant, and/or depositing an organosilane coupling agent on the water impermeable substrate prior to the forming of the capping layer. In some embodiments, a dense dielectric layer (e.g., BCB) may be between the dielectric encapsulant and the substrate. The dense dielectric layer may comprise a photoimageable and/or laser ablatable material that is patterned to form openings, windows, and/or pockets over sensitive areas or components such that the dielectric encapsulant (or a precursor thereof) can be dispensed directly onto the sensitive regions to avoid or reduce dielectric loading by the dense dielectric layer.

Figure 8:
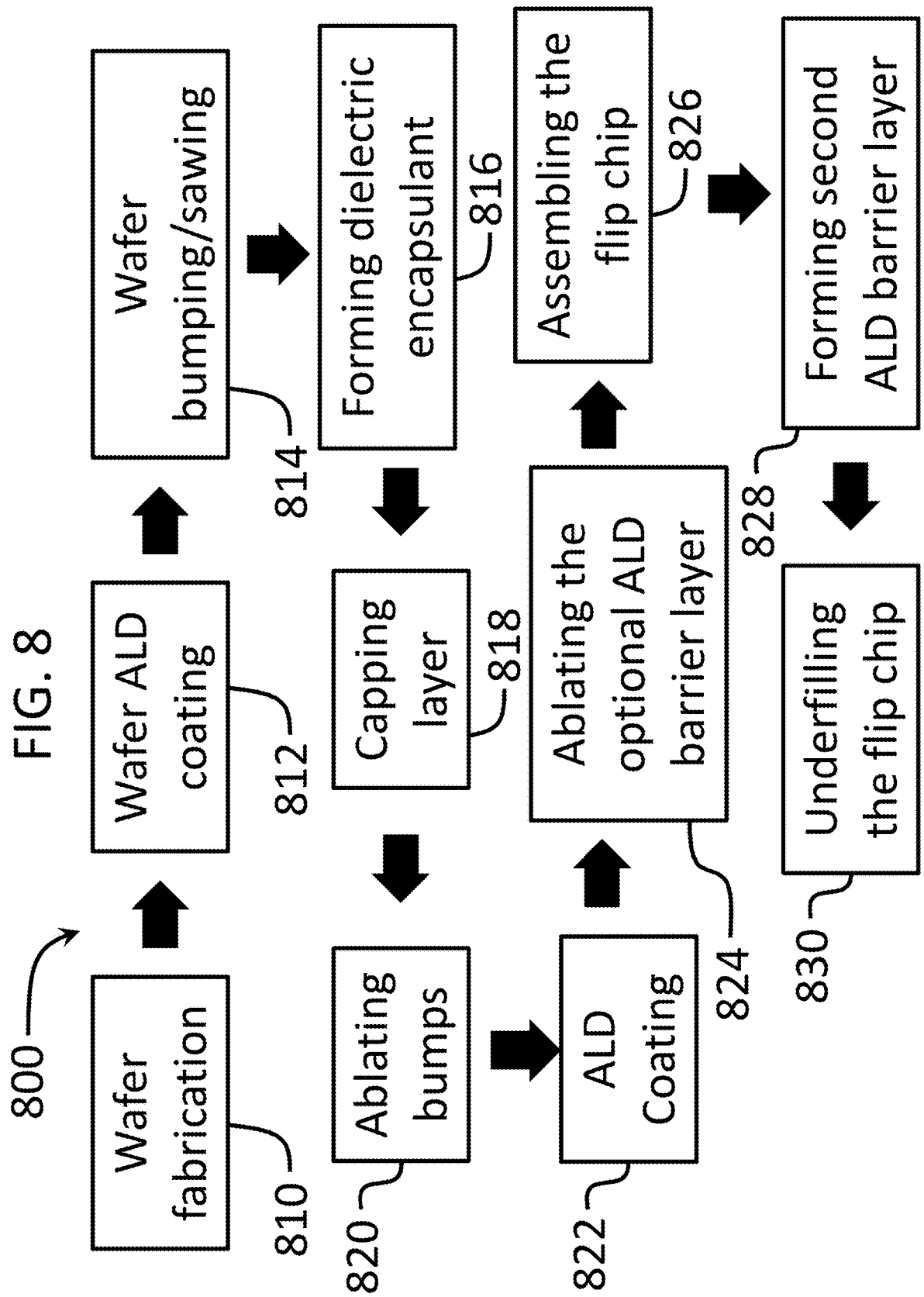
FIG. 8 is a flow chart showing an embodiment of a method of manufacturing a flip chip.

Embodiments of methods of forming the electronic device may include additional acts. For example, FIG. 8 is a flow chart showing an embodiment of a method of manufacturing a flip chip. In the embodiment shown in FIG. 8, (800) a method of manufacturing a flip chip includes: (810) fabricating a wafer; (812) optionally ALD coating the wafer; (814) bumping and/or sawing the wafer to form a flip chip; (816) forming a dielectric encapsulant on the flip chip and, optionally, laser ablating excess encapsulant from a portion of the flip chip surface; (818) capping the dielectric encapsulant with a capping layer; (820) patterning the capping layer by ablating the capping layer from bumps on the flip chip and a portion of the flip chip surface outside of the dielectric encapsulant area; optionally, (822) ALD coating the patterned capping layer on the flip chip to form the barrier layer; (824) ablating the optional ALD barrier layer coating from the bumps, (826) assembling the flip chip and cleaning the assembly; optionally, (828) forming a second ALD barrier layer over the capping layer and assembly; and (830) underfilling the flip chip.

Figure 9:
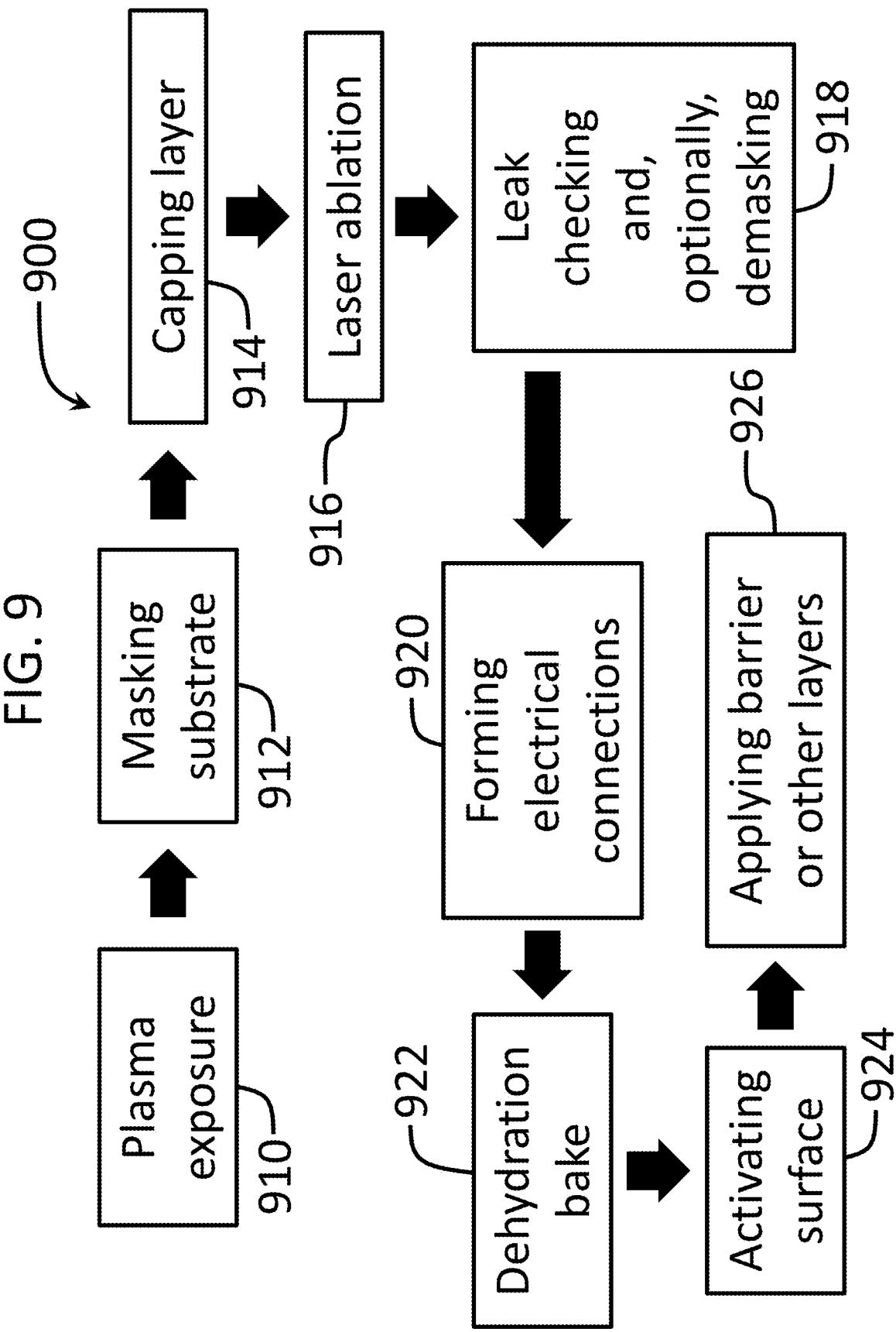
FIG. 9 is a flow chart showing an embodiment of a method of manufacturing a capping layer including a polymer on an aerogel film.

FIG. 9 is a flow chart showing an embodiment of a method of manufacturing a dielectric encapsulant having a capping layer and a barrier layer. It is noted that each of the acts shown in FIG. 9 may not be required to practice embodiments of the present disclosure. In the embodiment shown in FIG. 9, (900) a method of manufacturing a dielectric encapsulant with a capping layer and a barrier layer includes: (910) optionally exposing a surface of a dried dielectric encapsulant on a substrate to impingement by an inert plasma; (912) optionally masking the substrate backside ground/thermal interfaces; (914) capping the dielectric encapsulant with a capping layer; (916) laser ablating the capping layer from electrical connections and, optionally, demasking the backside ground/thermal interfaces; (918) optionally checking for leaks (e.g., by visual inspection for a stream of bubbles emanating from the capped dielectric encapsulant when submerged in a shallow bath of solvent, such as methanol and/or acetone); (920) optionally making electrical connections (e.g., flip chip solder connections and/or wire bonding); (922) dehydrating the dielectric encapsulant, capping layer, and the substrate by baking; (924) optionally activating a surface of the capping layer; and (926) applying a barrier layer (e.g., inorganic and/or composite organic/inorganic layers) and/or other layers.

As used herein, the term "uniform" and similar terms may refer to a feature that is uniform or substantially uniform. As used herein, the terms "continuous," "continuously," and the like may refer to features that are continuous or substantially continuous, or features that are carried out continuously or substantially continuously.

As used herein, the term "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification. Also, in the context of the present application, when a first element is referred to as being "on" a second element, it can be directly on the second element or be indirectly on the second element with one or more intervening elements interposed therebetween. Like reference numerals designate like elements throughout the specification.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An electronic device comprising:
   a water impermeable substrate;
   at least one electronic circuit on the water impermeable substrate;
   a dielectric encapsulant comprising an aerogel film on the electronic circuit;
   a capping layer comprising a polymer on the dielectric encapsulant; and
   a barrier layer on the capping layer,
   wherein the water impermeable substrate, the dielectric encapsulant, the capping layer, and the barrier layer form a hermetically sealed micro-cavity.

2. The electronic device of claim 1, wherein the barrier layer comprises an inorganic material or a composite of organic and inorganic materials.

3. The electronic device of claim 2 wherein the inorganic material is selected from metal oxides, metal alloys, metal carbides, metal nitrides, and mixtures thereof.

4. The electronic device of claim 3, wherein the metal oxide is selected from silicon dioxide, aluminum oxide, zirconium dioxide, hafnium dioxide, titanium dioxide, and mixtures thereof,
   wherein the metal carbide is silicon carbide, and
   wherein the metal nitride is silicon nitride.

5. The electronic device of claim 2, wherein the transmission rate of water through the capping layer and the barrier layer is less than 0.01 gram/meter$^2$/day when measured at 40° C. and 90% relative humidity.

6. The electronic device of claim 1, wherein the capping layer comprises poly(para-xylylene).

7. The electronic device of claim 6, wherein the poly(para-xylylene) is selected from the group consisting of unsubstituted linear poly(para-xylylene), poly-monochloro (para-xylylene), (poly-dichloro(para-xylylene), poly(para-xylylene) having the alpha hydrogen atoms substituted with fluorine atoms, poly(para-xylylene) having the four hydrogen atoms bonded to the aromatic ring substituted with fluorine atoms, and combinations thereof.

8. The electronic device of claim 1, wherein the capping layer has a thickness of 1 μm to 25 μm.

9. The electronic device of claim 1, wherein hydroxyl groups are present on a surface of the barrier layer.

10. The electronic device of claim 1, wherein the electronic circuit is water sensitive or sensitive to dielectric loading.

11. The electronic device of claim 1, wherein the barrier layer is formed by atomic layer deposition.

12. The electronic device of claim 1, wherein the water impermeable substrate comprises a material selected from the group consisting of silicon (Si), gallium arsenide (GaAs), gallium nitride (GaN), silicon germanium (SiGe), silicon carbide (SiC), indium phosphide (InP), alumina, aluminum nitride (AlN), beryllium oxide (BeO), and combinations thereof.

13. The electronic device of claim 1, further comprising a base layer between the dielectric encapsulant and the water impermeable substrate, wherein the base layer comprises a dielectric layer.

14. A method of preparing an electronic device, the method comprising:
    securing at least one electronic circuit on a water impermeable substrate;
    forming a dielectric encapsulant comprising an aerogel film on the electronic circuit;
    forming a capping layer comprising a polymer on the dielectric encapsulant; and
    forming a barrier layer on the capping layer, the water impermeable substrate, the dielectric encapsulant, the capping layer, and the barrier layer forming a hermetically sealed micro-cavity.

15. The method of claim 14, wherein the forming of the capping layer comprises vapor depositing the polymer on the dielectric encapsulant.

16. The method of claim 14, further comprising pretreating a surface of the dielectric encapsulant with a plasma treatment prior to the forming of the capping layer.

17. The method of claim 14, wherein the forming of the barrier layer comprises depositing the barrier layer by atomic layer deposition.

18. The method of claim 14, further comprising forming a base layer on the substrate prior to the forming of the dielectric encapsulant, wherein the base layer comprises a dielectric layer.

19. The method of claim 14, further comprising vapor depositing an organosilane coupling agent on the water impermeable substrate prior to the forming of the capping layer.

* * * * *